US007815970B2

(12) United States Patent
Schlesser et al.

(10) Patent No.: US 7,815,970 B2
(45) Date of Patent: Oct. 19, 2010

(54) CONTROLLED POLARITY GROUP III-NITRIDE FILMS AND METHODS OF PREPARING SUCH FILMS

(75) Inventors: Raoul Schlesser, Cary, NC (US); Ramón R. Collazo, Raleigh, NC (US); Zlatko Sitar, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 1196 days.

(21) Appl. No.: 11/382,806

(22) Filed: May 11, 2006

(65) Prior Publication Data

US 2006/0257626 A1     Nov. 16, 2006

Related U.S. Application Data

(63) Continuation of application No. PCT/US2005/043073, filed on Nov. 29, 2005.

(60) Provisional application No. 60/679,849, filed on May 11, 2005.

(51) Int. Cl.
*C23C 16/34* (2006.01)
(52) U.S. Cl. .................... 427/255.394; 427/255.7; 427/376.1; 427/402
(58) Field of Classification Search .......... 427/255.394, 427/255.7, 376.1, 402
See application file for complete search history.

(56) References Cited

U.S. PATENT DOCUMENTS

| | | | |
|---|---|---|---|
| 5,296,119 A | 3/1994 | Moustakas | |
| 5,385,862 A | 1/1995 | Moustakas | |
| 5,633,192 A | 5/1997 | Moustakas et al. | |
| 5,677,538 A | 10/1997 | Moustakas et al. | |
| 5,686,738 A | 11/1997 | Moustakas | |
| 5,725,674 A | 3/1998 | Moustakas et al. | |
| 5,847,397 A | 12/1998 | Moustakas | |
| 6,123,768 A | 9/2000 | Moustakas | |
| 6,284,042 B1 | 9/2001 | Sasaoka | |
| 6,576,054 B1 | 6/2003 | Melnik et al. | |
| 7,592,629 B2 * | 9/2009 | Lee et al. | 257/78 |
| 2003/0194853 A1 * | 10/2003 | Jeon | 438/591 |
| 2003/0198837 A1 | 10/2003 | Craven et al. | |
| 2004/0062282 A1 * | 4/2004 | Matsuoka et al. | 372/26 |
| 2007/0042560 A1 * | 2/2007 | Sumiya et al. | 438/400 |
| 2007/0138505 A1 * | 6/2007 | Preble et al. | 257/190 |
| 2009/0243043 A1 * | 10/2009 | Wang | 257/615 |

FOREIGN PATENT DOCUMENTS

| | | |
|---|---|---|
| JP | 2002270525 | 9/2002 |
| WO | 2005004213 | 1/2005 |

OTHER PUBLICATIONS

Kim, K.S., et al., "The effects of nitridation on properties of GaN grown on sapphire substrate by metal-organic chemical vapour deposition". Semicond. Sci. Technol. 14 (1999) pp. 557-560.*
Paek, Jong-Sik, et al., "Nitridation of sapphire substrate and its effect on the growth of GaN layer at low temperature". Journal of Crystal Growth 200 (1999) pp. 55-62.*
Sumiya, Masatomo, et al., "Effect of treatments of sapphire substrate on growth of GaN film". Applied Surface Science 244 (2005), pp. 269-272.*
Nagata, Takhiro, et al. "Surface Nitridation of c-Plane Sapphire Substrate by Near-Atmospheric Nitrogen Plasma". Japanese Journal of Applied Physics 48 (2009), pp. 040206-1 to 040206-3.*
Sumiya, Masatomo, et al., "In-Situ RHEED Observation of MOCVD-GaN Film Growth". Mat. Res. Soc. Symp. Proc. vol. 693, 2002, pp. I9.6.1-19.6.6.*
Huang, et al., "Comparative Study of Ga- and N-Polar GaN Films Grown on Sapphire Substrates by Molecular Beam Epitaxy," J. Vac. Sci. Technol. B, 2002, vol. 20(6), pp. 2256-2264.
Ammu et al., "Epitaxial Growth of GaN for Optoelectronic Applications," cited online Apr. 7, 2005 (http://www2.egr.uh.edu/~smotamar/GaN/GaN/html).
Collazo et al., "Polarity Control of GaN Thin Films Grown by Metalorganic Vapor Phase Epitaxy," Phys. Stat. Sol. (c), 2005, vol. 2(7), pp. 2117-2120.
Kim et al., "The Effects of Nitridation on Properties of GaN Grown on Sapphire Substrate by Metal-Organic Chemical Vapour Deposition," Semicond. Sci. Technol., 1999, vol. 14, pp. 557-560.
Losurdo et al., "The Effect of Substrate Nitridation Temperature and Buffer Design on the Quality of GaN Epitaxial Films," 10th European Workshop on MOVPE, Lecce, Italy, Jun. 8-11, 2003.
Mita et al., "Polarity Control of GaN Films Grown by Metal Organic Chemical Vapor Deposition on (0001) Sapphire Substrates," Mater. Res. Soc. Symp. Proc., 2005, vol. 831, pp. E3.20.1-E3.20.6.
Stutzmann et al., "Playing with Polarity," Phys. Stat. Sol. (b), 2001, vol. 228(2), pp. 505-512.
Tischler, "Advances in Metalorganic Vapor-Phase Epitaxy," IBM J. Res. Develop., 1990, vol. 34(6), pp. 828-848.

* cited by examiner

*Primary Examiner*—Bret Chen
(74) *Attorney, Agent, or Firm*—Womble Carlyle Sandridge & Rice, PLLC

(57) ABSTRACT

The present invention provides methods of preparing Group III-nitride films of controlled polarity and substrates coated with such controlled polarity films. In particular, the invention provides substrate preparation steps that optimize the substrate surface for facilitating growth of a Group III-polar film, an N-polar film, or a selectively patterned film with both a Group III-polar portion and an N-polar portion in precise positioning. The methods of the invention are particularly suited for use in CVD methods.

33 Claims, 2 Drawing Sheets

CONTROLLED POLARITY GROUP III-NITRIDE FILMS AND METHODS OF PREPARING SUCH FILMS

CROSS-REFERENCE TO RELATED APPLICATIONS

This application is a continuation of International Application No. PCT/US2005/043073, filed Nov. 29, 2005, which claims the benefit of U.S. Provisional Application No. 60/679,849, filed May 11, 2005, both of which are incorporated by reference herein in their entirety.

FEDERALLY SPONSORED RESEARCH OR DEVELOPMENT

The research underlying this invention was supported in part with funds from Office of Naval Research (ONR) Grant No. N00014-01-1-0301. The United States Government may have an interest in the subject matter of this invention.

FIELD OF THE INVENTION

The present invention relates to controlled polarity Group III-nitride films, substrates coated with such films, and methods of preparing such films. In particular, the invention provides for control of the polarity of Group III-nitride films prepared by deposition methods, such as CVD, and for Group III-nitride based lateral polarity heterostructures and homostructures prepared by such methods.

BACKGROUND

Group III-nitride coated substrates are increasingly valued for their usefulness in preparation of electrical components. For example, Group III-nitride based semiconductors have become a leading material for use in the production of light emitting diodes (LEDs), particularly blue laser diodes, as well as high power, high temperature electronics. While Group III-nitride coatings have proven extremely useful and versatile, they have also proven somewhat difficult to prepare. Growth of such coatings is generally through epitaxial methods, such as Metal Organic Vapor Phase Epitaxy (MOVPE) or Molecular Beam Epitaxy (MBE).

Epitaxial methods for depositing Group III-nitride films are not without their problems. For example, epitaxial growth can be hindered by the lack of a single crystalline Group III-nitride substrate, or other high quality single crystalline substrates, with the same lattice parameters as the Group III-nitride film to be grown. Epitaxial growth of nitrides is often performed on sapphire or silicon carbide substrates. Even with such substrates, though, problems can arise due to lattice mismatch between the nitride epi-layer and the substrate.

The properties of the Group III-nitride film are also known to vary depending upon the polar orientation of the film. Group III-nitride films crystallizing in a wurtzite crystal structure possess a polar axis oriented along the (0001) direction, as illustrated in FIG. 1. The polarity arises from the non-centrosymmetric crystal structure of the Group III-nitrides. The most common growth direction of the Group TII-nitrides is normal to the (0001) basal plane, where the atoms are arranged in bilayers consisting of two closely spaced hexagonal layers, one containing the cations and the other the anions, so that the bilayers have polar faces, as shown in FIG. 1. The polar structure with three bonds of the Group III atom facing toward the substrate and the single bond facing away from the substrate is commonly referred to as being Group III-polar. Accordingly, the mirrored structure with three bonds of the Group III atom facing away from the substrate and the single bond facing the substrate is commonly referred to as being Nitrogen-polar (or N-polar). When a multi-plane substrate, such as sapphire, is used, the polar orientation can also be described in terms of the substrate plane. For example, when using c-plane sapphire as the substrate, the Group III-polar orientation can be referred to as the +c orientation, while the N-polar orientation can be referred to as the −c orientation, as illustrated in FIG. 2.

Polar orientation is not to be confused with surface termination of the film components, as each orientation may be terminated with either one of the species comprising the film (e.g., gallium or nitrogen in a GaN film). Rather, polar orientation determines the direction of the spontaneous polarization vector and, thus, determines the type of charge induced at the surface/interface. Along with the piezoelectric polarization, the polarization-induced charge influences the electrical and optical properties of the coated substrate. Control of the polar orientation on a macroscopic and microscopic scale is desirable to exploit the combined properties of both types of orientations.

Given the usefulness of the Group III-nitride films, and components incorporating such films, and the different properties inherent to the polar orientations of the films, it is desirable to have a method for preparing a Group III-nitride film of controlled polarity. Further, it would be useful to have a method for preparing a dual polarity Group III-nitride film. Such methods, as well as Group III-nitride film coated substrates of specified polar orientation are provided according to the present invention.

SUMMARY OF THE INVENTION

The present invention provides methods for preparing Group III-nitride films of controlled polarity and coated substrates wherein the coating comprises a controlled polarity film. The methods of the present invention are particularly useful in relation to Chemical Vapor Deposition (CVD) growth techniques. The invention allows for preparation of either Group III-polar films, N-polar films, or dual polarity films. Such versatility is realized by identifying and selecting appropriate substrate pre-treatments, as well as appropriate growth conditions. Surprisingly, smooth films of each type of polarity are achieved according to the invention, and the same growth rate for both types of polarities under the same growth conditions is also achieved.

In one aspect, the invention is directed to a method of depositing a Group III-nitride film on a substrate with an exposed surface. In particular, the method allows for deposition of a controlled polarity Group III-nitride film such that the film can be selectively grown as either a Group III-polar film or an N-polar film. Surprisingly, such controlled polarity can be accomplished according to a single deposition method, such as CVD.

In one particular embodiment of this aspect of the invention, the method comprises performing a nitridation of the substrate to cover the exposed surface of the substrate with a nitridation layer. Preferentially, the nitridation comprises supplying ammonia (preferably diluted with a gas that is suitable according to the invention, such as nitrogen gas), and the nitridation is carried out at a temperature greater than about 800° C. for a time of less than about 5 minutes. The method according to this embodiment further comprises depositing a Group III-nitride film on the surface of the substrate with the nitridation layer thereon such that the deposited film is N-polar. Preferably, the depositing step comprises supplying a Group III metal precursor and a nitrogen precursor with a carrier consisting of a non-reactive gas such that the nitrogen precursor/Group III precursor ratio is less than about 1000. Advantageously, according to this embodiment of the invention, the deposited film has an rms roughness of less than about 8 nm.

According to still another embodiment of the invention, there is provided a method of depositing a Group III-nitride film on a substrate with an exposed surface. In this embodiment, the method comprises: performing a nitridation of the substrate to cover the exposed surface of the substrate with a nitridation layer; applying a buffer layer to the surface of the substrate with the nitridation layer thereon; annealing the substrate with the buffer layer applied thereto; and depositing a Group III-nitride film on the surface of the substrate with the annealed buffer layer thereon such that the deposited film is Group III-polar. Preferably, the nitridation step comprises supplying ammonia diluted with a non-reactive gas and is carried out at a temperature greater than about 800° C. for a time of less than about 10 minutes.

It is desirable for the buffer layer to be applied to a thickness of about 10 nm to about 100 nm. Preferentially, the annealing step comprises supplying ammonia diluted with a non-reactive gas and is carried out at a temperature of between about 950° C. and about 1100° C. for a time of between about 5 minutes and about 30 minutes. Further, the depositing step comprises supplying a Group III metal precursor and a nitrogen precursor, each precursor supplied in a non-reactive carrier gas, such that the nitrogen precursor/Group III precursor ratio is less than about 1000. This embodiment of the invention advantageously allows for the deposited film to have an rms roughness of less than about 8 nm, preferably less than about 1 nm.

The novel ability to control the polarity of a Group III-nitride applied to a substrate gives rise to yet another aspect of the invention, wherein it is possible to prepare a dual polarity Group III-nitride film (i.e., a film deposited on a substrate according to a single method wherein a portion of the film is Group III-polar and the remaining portion of the film is N-polar). Such a method is possible according to the unique method of substrate preparation that facilitates Group III-polar growth on a particularly prepared portion of the substrate surface and that facilitates N-polar growth on another particularly prepared portion of the substrate.

Accordingly, in one embodiment, the invention is directed to a method of preparing a substrate with an exposed surface for simultaneous deposition of a dual polarity Group III-nitride film. Particularly, the method comprises the following steps: performing a first nitridation of the substrate to cover the exposed surface of the substrate with a nitridation layer; applying a buffer layer (such as an aluminum nitride buffer layer) to the substrate surface with the nitridation layer thereon; annealing the buffer layer applied to the substrate; selectively patterning the substrate surface by selectively removing a portion of the buffer layer from the substrate surface, thereby exposing a portion of the substrate surface; optionally, annealing the selectively patterned substrate surface; and performing a second nitridation of the substrate such that a portion of the substrate surface is covered with an exposed nitridation layer and the remaining portion of the substrate surface is covered with an exposed buffer layer. The method can further comprise $H_2$ annealing the substrate prior to the first nitridation.

In another embodiment of the invention, there is provided a method for depositing a dual polarity Group III-nitride film on an exposed substrate surface. In particular, the method comprises: performing a first nitridation of the substrate to cover the exposed surface of the substrate with a nitridation layer; applying a buffer layer (such as an aluminum nitride buffer layer) to the substrate surface with the nitridation layer thereon; annealing the buffer layer applied to the substrate; selectively patterning the substrate surface by selectively removing a portion of the buffer layer from the substrate surface, thereby exposing a portion of the substrate surface; optionally, annealing the selectively patterned substrate surface; and performing a second nitridation of the substrate such that a portion of the substrate surface is covered with an exposed nitridation layer and the remaining portion of the substrate surface is covered with an exposed buffer layer; and depositing a Group III-nitride film on the substrate such that the film deposited on the portion of the substrate with the exposed nitridation layer is N-polar and the film deposited on the portion of the substrate with the exposed buffer layer is Group III-polar.

In one particular embodiment, the inventive method is particularly characterized in that substantially no hydrogen gas is introduced from external sources (i.e., as a carrier or a diluent). Instead, nitrogen gas, or another non-reactive gas, is used as both a carrier and a diluent in the substrate surface preparation and the Group III-nitride film deposition. In another embodiment, the invention is characterized in that the ratio of the nitrogen precursor (such as ammonia) to the Group III precursor is less than about 1000, preferably less than about 500.

The invention is further characterized in that, when a dual polarity film is prepared, the Group III-polar portion of the film and the N-polar portion of the film are each deposited at about the same rate. In particular, the deposition of the Group III-nitride film is mass transfer limited, likely arising from the use of a non-reactive gas as a carrier and a diluent, as well as from the absence of introduced hydrogen gas, which slows deposition with an increase in temperature.

In yet another aspect of the invention, there is provided a coated substrate comprising a substrate having a surface, and a Group III-nitride film deposited on the surface of the substrate. In one particular embodiment of this aspect of the invention, the Group III-nitride film is N-polar. Further, according to this embodiment of the invention, the N-polar film is measurably smooth such that the film has an rms roughness of less than about 8 nm, preferably less than about 3 nm.

According to another embodiment of the invention, the Group III-nitride film is a selectively patterned, dual polarity film comprising at least one Group III-polar portion and at least one N-polar portion selectively patterned over the surface of the substrate. According to this embodiment of the invention, both the Group III-polar portion of the film and the N-polar portion of the film are measurably smooth such that the film has an rms roughness of less than about 8 nm, preferably less than about 3 nm.

BRIEF DESCRIPTION OF THE DRAWINGS

Figure 1:
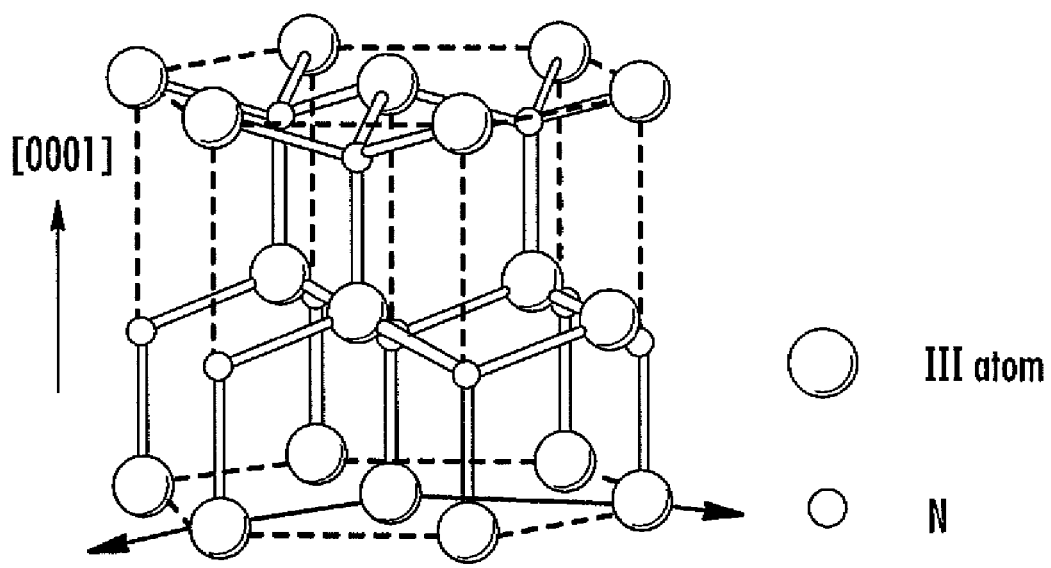
Figure 2:
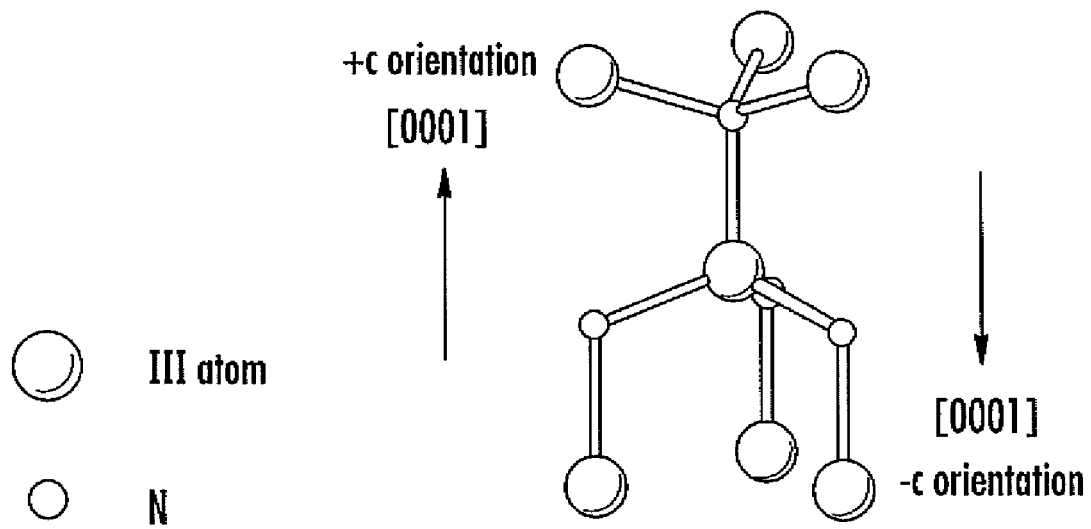
Figure 3:
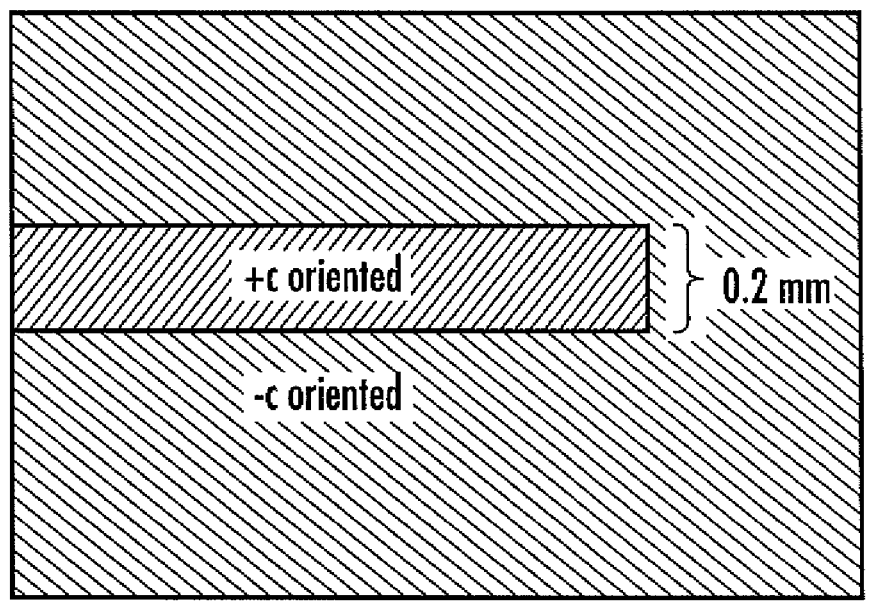
Figure 4:
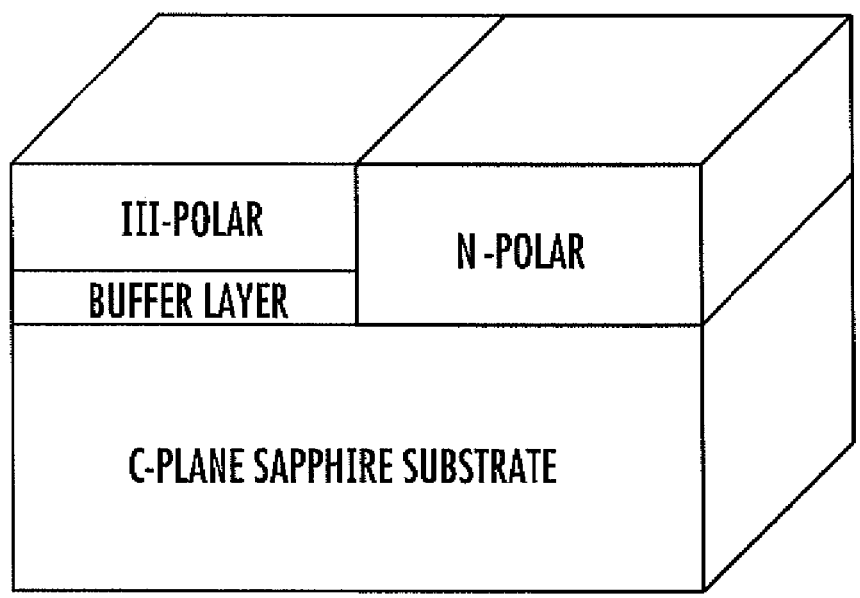

Having thus described the invention in general terms, reference will now be made to the accompanying drawing, which is not necessarily drawn to scale, and wherein:

FIG. 1 illustrates a wurtzite crystal structure with a polar axis as commonly seen in Group III-nitride films;

FIG. 2 illustrates the particular polar orientation of a Group III-nitride crystal in reference to a substrate;

FIG. 3 illustrates a dual polarity film prepared according to one embodiment of the invention with a stripe of Group III-polar film surrounded by N-polar film; and FIG. 4 provides a three-dimensional illustration of a dual polarity film according to one embodiment of the invention showing a Group III-polar layer deposited on a buffer layer and an N-polar layer deposited directly on the substrate.

DETAILED DESCRIPTION OF THE INVENTION

The present inventions now will be described more fully hereinafter with reference to the accompanying drawing, in which one, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used in the specification, and in the appended claims, the singular forms "a", "an", "the", include plural referents unless the context clearly dictates otherwise.

The present invention provides controlled polarity Group III-nitride films and methods of depositing such films on a substrate. The invention particularly provides a scheme for controlling the polarity of Group III-nitride films prepared by CVD. Present methods for depositing Group III-nitride films are limited in their ability to control the polar orientation of the film, as well as their ability to control the physical characteristics of the film, such as surface smoothness. The methods of the present invention, however, allow for control of the polar orientation of the film (i.e., the preparer can deposit a Group III-polar film, an N-polar film, or a precisely patterned dual polarity film). Therefore, it is possible, according to the invention, to prepare controlled polarity Group III-nitride films. Surprisingly, a controlled polarity film that is either Group III-polar or N-polar can be prepared according to the same general type of deposition method.

It is also possible, according to the invention, to prepare Group III-nitride based lateral polarity homostructures and heterostructures. While many types of device structures are often, incorrectly, referred to as heterostructures, the term correctly refers to structures comprising more than one type of material or compound. For example, a film comprising AlGaN and GaN is correctly referred to as a heterostructure. On the contrary, structures comprised of only a single compound, such as GaN, are correctly referred to as homostructures, even if the structure has differently doped portions (e.g., and n-GaN/p-GaN structure) or has portions of different polarity (e.g., Ga-polar GaN/N-polar GaN). The present invention is particularly suited for preparing various types of homostructures and heterostructures.

Group III-nitrides, as discussed herein, are understood to refer to nitrides of any element commonly classified in Group III of the periodic chart, and in particular, nitrides of aluminum (Al), gallium (Ga), and indium (In). Specific examples in the present disclosure may refer to a specific Group III-nitride, such as gallium-nitride (GaN). Further, for the sake of simplicity, the invention in general may also be described in reference to a specific Group III-nitride; however, reference to, or description generally related to, a specific Group III-nitride is not intended to limit the scope of the invention. Rather, the invention is broadly directed to films of all Group III-nitrides and their alloys, and to methods of depositing (or growing) such films on a substrate.

Various different substrates can be used in preparing the Group III-nitride films according to the invention. As previously noted, lattice mismatch between the nitride film and the substrate can be a barrier to growth of quality films. The methods of the present invention are particularly useful for preparing quality films arising from the identification and implementation of substrate preparations beneficial for improving film quality and for providing polarity control of the film. Given the beneficial substrate preparation provided by the invention, various substrates can be used, and the substrate preparation can be appropriately tailored to the substrate.

Substrates commonly used in film growth methods, such as CVD, can also be used in the present invention. For example, sapphire and silicon carbide are both useful as substrates according to the invention. In particular, the invention is described herein in reference to the growth of Group III-nitride films on a c-plane sapphire wafer substrate. Such description is made for purposes of providing complete disclosure of the invention and for simplicity. The invention, however, is not intended to be limited to the use of a particular substrate, such as sapphire, and it is understood other possible substrates are also encompassed by the invention. For example, a substrate according to the invention could also comprise a wafer formed of at least one Group III-nitride material, such as aluminum nitride and gallium nitride.

The method of the invention is particularly described throughout in relation to a CVD process. Particular types of CVD useful according to the invention include Metal Organic Chemical Vapor Deposition (MOCVD), Metal Organic Vapor Phase Epitaxy (MOVPE), and Hydride Vapor Phase Epitaxy (HVPE). MOVPE, in particular, is a well-established technique for epitaxial growth of Group III-nitrides and is useful for preparing films, and associated devices, according to very demanding specifications, including fine control of layer thickness, interface structure, material composition, and impurity concentration. While the methods of the invention are particularly suited for use in association with CVD, specifically MOCVD, HVPE, and MOVPE, the invention is not limited to such methods. Rather, it is intended that the methods of the invention could be practiced with other methods useful for depositing a film on a substrate, as would be envisioned by one of skill in the art.

It is commonly held in the art that the nitrogen-rich conditions and the comparatively high substrate temperatures associated with CVD always produce +c oriented films (i.e., Group III-polar films) on a c-plane sapphire substrate. In contrast, −c oriented films (N-polar films) historically have only been grown by MBE. The technical difficulties of using MBE as the growth technique have hindered the technological development of such devices. While recent work has indicated −c oriented films could be grown by other methods, such as MOCVD, film quality and strict polarity control have still been lacking in the art.

N-polar GaN films known in the art are characterized by a rough surface morphology featuring hexagonal pyramids, while the Ga-polar films known in the art typically have a mirror-like appearance. Mixed polarity films (films containing small domains of both polarities) are difficult to distinguish from the single films, and surface morphology alone thus does not provide an unambiguous identification of film polarity. Several techniques have been used to identify the polar orientation of GaN films. The easiest, but destructive, technique uses the different chemical reactivity of each polar surface. Ga-polar surfaces are resistant to most chemical etchants except at defects propagating to the surface, while N-polar surfaces are reactive to $KOH/H_2O$ solutions or KOH/NaOH eutectics.

Just as the difference in chemical reactivity between the Ga-polar and the N-polar films affects the etch rate of the film, the growth rate observed for each polarity is also recognized as being different. Ga-polar surfaces typically grow faster than N-polar surfaces. This difference in growth rate is not only observed in CVD processes, but also in the bulk growth of GaN and AlN generally. A faster growing Ga-polarity is not desirable, as the faster growing Ga-polarity will overgrow a competing N-polar domain in a dual polarity heterostructure. The ability to overcome these limitations, as well as further advantages, is provided by the present invention.

The present invention provides methods for preparing Group III-nitride films of a controlled polar orientation. In particular, the invention provides film preparation methods characterized by a unique series of substrate preparation steps that can be selectively used in preparing a substrate for use in a Group III-nitride film deposition method for preparing either a Group III-polar film or an N-polar film. Furthermore, each polar orientation of the Group III-nitride film can be deposited as a smooth film having an rms roughness of less than about 8 nm, preferably less than about 3 nm, as described in more detail below.

The ability to control polar orientation of the deposited film is achieved according to the invention by optimizing substrate preparation such that the substrate is uniquely conditioned for facilitating film deposition of a specific polar orientation, even when using a film deposition method such as MOCVD, which has generally been regarded as only being capable of depositing Group III-polar films.

Substrate preparation methods established by the invention as being particularly useful for conditioning the substrate for facilitating growth of N-polar Group III-nitride films comprise performing a fast, high temperature nitridation of the substrate. If the exposed substrate surface is properly nitridated according to the invention, the Group III-nitride film can be deposited in a controlled N-polar orientation by known CVD methods.

Substrate preparation methods established by the invention as being particularly useful for conditioning the substrate for facilitating growth of Group III-polar Group III-nitride films comprise nitridation of the exposed substrate surface, application of a buffer layer, preferably of optimized thickness, and annealing of the buffer layer. Each of the three steps can be carried out as generally described according to the invention.

As indicated above, the present invention provides a new and useful advance over previous film deposition methods in that the film can be deposited in a controlled polarity fashion using a single type of deposition, such as CVD. Accordingly, in a single general method, a Group III-polar film, an N-polar film, or a dual polarity (both Group III-polar and N-polar) can be prepared simply by optimizing the substrate preparation steps. The preceding description discussed controlled preparation of a Group III-polar film or an N-polar film by a CVD method utilizing specific substrate preparation steps. The following description discusses preparation of a dual polarity film utilizing a unique combination of the substrate preparation steps. Accordingly, it is recognized that the description of the substrate preparation steps that follows would also be applicable to the controlled single polarity films as described above.

In one embodiment, the invention provides a method of preparing a substrate for simultaneous deposition of a dual polarity Group III-nitride film. In one specific embodiment, the Group III-nitride film is a GaN film. Dual polarity GaN films can be achieved by systematic substrate treatments consisting of nitridation, buffer layer deposition, and buffer layer anneal time. N-polar films can be obtained when GaN films are deposited on nitridated substrates, even after nitridation lasting only a few seconds. Ga-polar GaN films can be obtained by optimizing the thickness of an applied buffer layer and by using the proper annealing conditions. Conversely, GaN films on an improperly treated buffer layer lead to N-polar or mixed-polarity films.

In preparing the substrate for simultaneous deposition of a dual polarity film, the method comprises performing a first nitridation of the substrate. Nitridation is generally understood to be a high temperature anneal of the exposed substrate surface in an ambient providing reactive nitrogen, thereby reacting nitrogen with the exposed surface of the substrate. Any nitrogen source providing reactive nitrogen would be understood as being useful according to the invention. In one preferred embodiment, the nitrogen source is $NH_3$. Non-limiting examples of other nitrogen sources that could be used include amine organic compounds and hydrazine compounds.

The present invention is particularly characterized in that the method of preparing the Group III-nitride film is carried out such that substantially no hydrogen gas is introduced from external sources. In particular, the nitridation and annealing steps described herein are preferentially performed without the introduction of any substantial amounts of hydrogen gas. Previously known methods for depositing a Group III-nitride film use $H_2$ gas. In particular, such previously known methods use $H_2$ gas as a diluent, a carrier, or both. The present invention, however, is a departure from the art in that the introduction of $H_2$ gas is substantially or completely avoided.

As would be recognizable by one of skill in the art, reactions carried out during the method of the invention, particularly those wherein $NH_3$ is a reactant, may lead to formation of $H_2$ gas. Such in situ formation of $H_2$ gas is fully considered in light of the above statements relating to the avoidance of introduction of $H_2$ gas. Accordingly, in situ formation of $H_2$ gas arising from the reactions of the method is encompassed by the invention and does not limit the preferential embodiments of the invention wherein substantially no $H_2$ gas is introduced from external sources. In other words, while $H_2$ gas may be formed in situ according to the invention, it is preferably that $H_2$ gas is not specifically introduced from external sources, such as being used as a diluent or a carrier gas. Therefore, the preference that no $H_2$ gas, or substantially no $H_2$ gas, is introduced from external sources is not limited by any in situ formation of $H_2$ gas that may occur.

As used herein, the phrase "substantially no $H_2$ gas" is intended to encompass situations wherein hydrogen is present, but only in small amounts, particularly amounts much smaller than what would be normally expected according to previous deposition methods. Accordingly, a method wherein substantially no $H_2$ gas is introduced is understood to encompass the use of a gas, such as a diluent or a carrier, wherein the gas comprises less than about 5% $H_2$ gas, by volume, preferably less than about 2% $H_2$ gas, most preferably less than about 1% $H_2$ gas. In one particularly preferred embodiment, the methods of the invention are carried out such that the introduction of $H_2$ gas is completely avoided. In particular, it is preferable for the nitridation and annealing steps of the method to be carried out such that introduction of $H_2$ gas from external sources is complete avoided.

Although addition of $H_2$ gas, such as for use as a carrier or diluent, is unnecessary to practice the present invention, in less preferred embodiments, as much as 10% $H_2$ gas, or even 20% $H_2$ gas, by volume, can be introduced according to the method of the invention. However, such embodiments are less preferred, as increases in the amount of $H_2$ gas require increases in the amount of $NH_3$ necessary for the process.

In light of the above, it is preferable for a non-reactive gas to be used throughout the inventive methods as both a diluent and a carrier. Any gas that is non-reactive within the reaction parameters described herein can be used as a substitute for $H_2$ gas according to the invention. As used herein, non-reactive is intended to refer to any gas that does not react with the exposed substrate surface, the Group III precursor, or the nitrogen precursor used in the method. In particular, any gas generally known as an inert gas could be used, such as the Group VIII noble gasses.

In one preferred embodiment, nitrogen gas is used as the non-reactive gas. While $N_2$ is understood to be relatively chemically inert, one of skill in the art would recognize that $N_2$ gas may be reactive under certain conditions (such as with some metals under high heat). According to the present invention, $N_2$ gas is understood to be non-reactive in that it does not interfere with the reactions of the inventive methods. Therefore, as used herein, the phrase "non-reactive" is meant to encompass $N_2$ gas. Furthermore, for the sake of simplicity, the use of non-reactive gases according to the invention may be further described herein in specific relation to the use of $N_2$. Such description, however, is not intended to limit the invention to such an embodiment. Rather, the invention is fully intended to encompass any non-reactive gas as described herein.

Nitridation in the present invention is therefore characterized in that the reactive nitrogen source is diluted with $N_2$, which is particularly useful for facilitating later deposition of a smooth GaN film, either Ga-polar or N-polar. The first nitridation is carried out at a temperature equal to or greater than about 800° C. Preferably, the temperature is greater than about 850° C., more preferably greater than about 900° C., most preferably greater than about 950° C.

As noted above, the presence of a nitridation layer is necessary for the deposition of N-polar films. The exact chemical nature of the nitridation layer depends upon the substrate. With a c-plane sapphire substrate (i.e., $Al_2O_3$), nitridation produces an AlN monolayer on the exposed substrate surface. The monolayer is specific for promoting formation of N-polar films on the nitridated surface in that the monolayer is particularly formed of Al—O—N bonds on the sapphire surface. While the underlying theory for how the Al—O—N nitridation layer facilitates N-polar film formation is not completely understood, it is understood, according to the invention, that such a nitridation layer is necessary for forming smooth N-polar films. Accordingly, nitridation should be carried out for a time sufficient to ensure complete nitridation of the substrate. However, it is beneficial for the nitridation time to be limited. Excessive nitridation of the exposed substrate surface can lead to the formation of multiple, stacked AlN layers, which is undesirable according to the invention, as it can cause the later applied N-polar GaN film to have a rough surface morphology.

Nitridation duration beneficial for promoting smooth N-polar films can vary depending upon the substrate type and the reaction parameters. In particular, nitridation duration is dependent upon the nitridation temperature, as described above, and the concentration and source of the reactive nitrogen source. Nitridation should be carried out for a time of less than about 20 minutes. Preferably, nitridation is carried out for a time of less than about 15 minutes, more preferably less than about 10 minutes, still more preferably less than about 6 minutes, still more preferably less than about 3 minutes, and most preferably less than about 2 minutes. In one embodiment, nitridation is carried out in an ammonia ambient at a temperature of about 955° C. for a time of about 2 minutes.

The benefit of using a non-reactive gas as both a diluent and a carrier is surprising in light of the known art, which indicates that using $N_2$ as the sole diluent leads to rough GaN films with a mosaic structure. Use of a non-reactive gas as the sole diluent in the present invention was also found to be useful for facilitating similar deposition rates in the Ga-polar films and the N-polar films. Previous methods for preparing GaN films by MOCVD use $H_2$ as the sole diluent. In such methods, Ga-polar films have been reported to deposit faster than N-polar films. It has been established that the deposition rate is nearly constant at the typical deposition temperatures when a non-reactive gas is used as the sole diluent, while under $H_2$, the growth rate decreases with temperature. The present invention demonstrates mass-transfer limited deposition, which is necessary to circumvent the chemical reactivity difference between the two polarities and to achieve identical deposition rates for the two polarities.

During nitridation of the exposed substrate surface, it is preferred that the non-reactive gas diluent be present in an amount useful for maintaining a specified partial pressure of the reactive nitrogen source, such as $NH_3$. In one embodiment, $NH_3$ is used as the reactive nitrogen source, and the $NH_3$ partial pressure is preferably maintained at a level useful for reacting with exposed substrate surface, as would be easily calculable by one of skill in the art. In a particular embodiment, the $NH_3$ partial pressure is maintained by supplying a non-reactive gas, such as $N_2$, in an amount such that the ratio of $NH_3$ to the non-reactive gas is about 1:1.

After nitridation, a buffer layer is applied to the substrate. The buffer layer can comprise any material beneficial for facilitating deposition of Ga-polar films. For example, the buffer layer can itself comprise a nitride layer, in particular a Group III-nitride layer. In one particular embodiment of the invention, an aluminum nitride (AlN) buffer layer is applied over the nitrided substrate. In another embodiment, the buffer layer is a GaN layer. Useful buffer layers according to the invention are preferably both non-centrosymmetric and closely lattice-matched to the layers to be overgrown. Non-limiting examples of other buffer layers useful according to the invention include AlGaN alloys.

The AlN buffer layer applied after nitridation of the exposed surface of the substrate differs from the AlN monolayer formed during the nitridation. As described above, the thin AlN monolayer formed from the high temperature nitridation of the exposed sapphire substrate surface is actually formed of Al—O—N bonds, and a thin layer of such bonding type is beneficial for facilitating smooth N-polar GaN film deposition. By contrast, a thicker low temperature buffer layer, such as an AlN buffer layer, is beneficial for facilitating Ga-polar GaN film deposition. Facilitation of such Ga-polar GaN film deposition arises from both the greater thickness of the AlN buffer layer, as well as the strict Al—N bonding within the layer (i.e., the absence of Al—O—N bonds formed in the nitridation layer).

As previously noted, the presence of a buffer layer, such as AlN, is necessary for inducing Ga-polar film deposition. The mere presence of the buffer layer, however, is insufficient to ensure quality, controlled film deposition of a Ga-polar orientation. To ensure such controlled deposition, it is beneficial to optimize both the time and the temperature of the buffer deposition step, thus forming a buffer layer of optimized thickness.

The step of applying a buffer layer to the surface of the substrate with the nitridation layer thereon comprises supplying buffer layer precursors at a comparatively low temperature for a specified time period to apply a buffer layer of a desired thickness. While Group III nitrides can be used as the buffer layer, the invention is not limited to such and can further encompass other types of buffer materials suitable for providing a lattice matching structure for facilitating deposition of Ga-polar Group III-nitride films. When the buffer layer comprises a nitride, a reactive nitrogen source, such as those previously described herein can be used. When the buffer layer is a Group III nitride, a Group III precursor, particularly a Ga precursor, an Al precursor, or an In precursor, can be used. In one particular embodiment, the Group III precursor comprises trimethylaluminum (TMA) and the nitrogen precursor is $NH_3$. A non-limiting example of a further Group III precursor includes triethylaluminum, and non-limiting examples of further nitrogen precursors include hydrazines and amines. While other such nitrogen precursors could be used, and are encompassed by the invention, for the sake of simplicity, the invention is more fully described herein in relation to the use of $NH_3$ as an example of the nitrogen precursor. It is expected that one of skill in the art, with the teaching provided herein, would be able to practice the invention with other nitrogen precursors based upon the $NH_3$ examples. The mole ratio of nitrogen precursor to Group III precursor is preferably between about 10,000 and about 40,000, more preferably about 15,000 and about 35,000, most preferably about 20,000 and about 30,000.

As in the nitridation step, the method is particularly characterized in that a non-reactive gas, such as $N_2$, is used as a diluent and a carrier for the buffer layer precursors; however, the partial pressure of the nitrogen precursor is independent of the amount of $N_2$ present. The $N_2$ only affects total reactor pressure in this step. Accordingly, the $N_2$ is preferably present in an amount useful for maintaining a desired total reactor pressure. In one embodiment, the total reactor pressure is about 20 Torr.

In one embodiment of the invention, the temperature of buffer layer deposition is between about 500° C. and about 750° C. Preferably, the buffer layer deposition temperature is between about 525° C. and about 725° C., more preferably between about 550° C. and about 700° C., most preferably 575° C. and about 675° C.

The amount of time during which buffer layer deposition is carried out can depend upon the buffer layer deposition temperature. Generally, the time of buffer layer deposition is widely variable to allow for deposition of a buffer layer of a preferred thickness at a given temperature. Preferably, the time of buffer layer deposition is between about 2 minutes and about 20 minutes, more preferably between about 5 minutes and about 15 minutes, most preferably about 7 minutes and about 12 minutes. While the above ranges are given to provide guidance around preferred embodiments of the invention, the invention is to be understood to encompass buffer layer deposition times that are greater or less than those provided above as beneficial for depositing a buffer layer of a most useful thickness given a particular deposition temperature.

Accordingly, the time and temperature of buffer layer deposition can be optimized such that a buffer layer having a preferred thickness is applied to the substrate surface with the nitridation layer thereon. Preferably, the buffer layer applied to the substrate surface is of a thickness of about 10 nm to about 100 nm, more preferably a thickness of about 15 nm to about 75 nm, most preferably about 15 nm to about 50 nm. In one particular embodiment, the buffer layer thickness is about 20 nm to about 40 nm.

Following application of the buffer layer to the substrate surface, the method comprises annealing the buffer layer. In addition to optimization of buffer layer parameters, proper optimization of the buffer layer anneal is also desirable, particularly for ensuring later deposition of a smooth Ga-polar orientation GaN film. Accordingly, it is possible to control the polarity of the deposited GaN film by properly managing the steps of applying the buffer layer and annealing the buffer layer.

A properly applied and annealed buffer layer according to the invention results in a Ga-polar film with a mirror-like surface morphology. Application of a buffer layer of insufficient thickness, or over-annealing of the buffer layer, can result in a deposited GaN film of mixed polarity. Excessive annealing can also lead to sublimation of the buffer layer, resulting in a loss of part, or even all, of the buffer layer. Mixed polarity films are a generally random mixture of small domains of both polarities throughout the film. A mixed polarity film is an example of a film exhibiting uncontrolled dual polarity. Mixed polarity films are undistinguishable from N-polar films, having a generally rough surface morphology, and only show slower etching rates compared to N-polar films. Excessive annealing can further lead to complete loss of the previously applied buffer layer, which results in N-polar GaN film deposition. In all of these undesirable situations, the resulting GaN film has a rough surface morphology, which is opposite the mirror-like surface desired and achieved in Ga-polar GaN films using the method of the invention.

The step of annealing the buffer layer generally comprises supplying a flow of a reactive nitrogen precursor at high temperature for a specified period of time. The reactive nitrogen precursor can include known sources, such as those previously described herein. In one preferred embodiment, the nitrogen precursor is $NH_3$. As with the nitridation step, a non-reactive gas, such as $N_2$, is used as a diluent to encourage a surface structure beneficial for facilitating a smooth GaN film deposition. Preferably, $N_2$ is supplied such that the ratio of $NH_3$ to $N_2$ is maintained within a specified range.

In one embodiment of the invention, the temperature during annealing of the buffer layer is between about 500° C. and about 1150° C. In particular, the annealing step can begin at a temperature in the lower end of the range and be ramped up to a final annealing temperature. Alternately, a majority of the annealing can be performed within a specified temperature range. In such embodiments, the annealing temperature is preferably between about 900° C. and about 1125° C., more preferably between about 950° C. and about 1100° C., most preferably 1000° C. and about 1100° C.

The amount of time during which the annealing step is carried out can depend upon the annealing temperature. Preferably, the annealing time is between about 5 minutes and about 30 minutes, more preferably between about 7 minutes and about 25 minutes, most preferably about 10 minutes and about 20 minutes. Of course, it is understood that the annealing time can depend upon the annealing temperature.

The $NH_3:N_2$ ratio described above can vary based upon the full set of reaction parameters. In one particular embodiment, annealing is carried out at a temperature of about 1030° C. for a time of about 10 minutes with a total reactor pressure of about 20 Torr using 0.4 slm $NH_3$ with 1.6 slm $N_2$.

The nitridated substrate surface with the buffer layer properly applied and annealed is in condition for facilitating deposition of a smooth Ga-polar GaN film. In order to prepare the substrate for simultaneous deposition of a dual polarity GaN film, however, it is necessary to selectively pattern the annealed buffer layer on the substrate surface so that a predetermined portion of the substrate surface is in condition for facilitating deposition of a smooth N-polar GaN film.

The step of selectively patterning the buffer layer generally comprises selectively removing a portion of the buffer layer from the substrate surface while retaining at least a portion of the buffer layer on the substrate surface. Preferably, the patterning is according to a predetermined method to facilitate preparation of a coated substrate exhibiting unique properties arising from the presence of both Ga-polarity and N-polarity in the GaN film at predetermined locations. Such patterning (i.e., selectively removing a portion of the buffer layer) can be by any method recognized as useful in the art for removing a buffer layer, particularly a Group III-Group V buffer layer, more particularly a Group III-nitride, such as AlN or GaN. In one embodiment of the invention, the step of selectively removing a portion of the buffer layer comprises using an evaporated metal mask to enhance adhesion of the metal mask to the buffer layer and protect it from removal. Preferentially, the metal mask is a titanium mask. A strong base can be used to remove the portion of the buffer layer not protected by the metal mask. In one particular embodiment, 6M KOH at 60° C. is applied to the substrate for 1 minute to remove the unprotected buffer layer to reveal the exposed substrate surface (e.g., bare sapphire). The metal mask is then removed by conventional methods to reveal the selectively patterned substrate surface with the buffer layer still covering a portion thereof.

Optionally, the selectively patterned substrate surface can be annealed once again. Such optional annealing step is particularly useful for facilitating rapid temperature increase to a stable temperature for further substrate preparation. The substrate surface patterning described above is generally conducted ex situ. In one particular embodiment, the reactor temperature is lowered to about room temperature, the substrate is removed and selectively patterned as described above, and the selectively patterned substrate is again placed in the reactor for the continuation of the process. For subsequent buffer layer annealing, a temperature ramp-up is performed. Preferably, the temperature ramp-up is performed rapidly, particularly being less than a time of about 15 minutes, more preferably less than about 10 minutes, most preferably a time of about 5 minutes. Longer times in this annealing step are discouraged and can lead to adverse changes in the buffer layer thickness (e.g., decomposition of the buffer layer). This step can be referred to generally as a temperature ramp step rather than an actual annealing step. For example, this step differs from the previously described anneal step in that a nitrogen source is not used so that uncontrolled nitridation of the exposed substrate surface can be avoided.

Next, in preparing the substrate for simultaneous deposition of a dual polarity Group III-nitride film, the method comprises performing a second nitridation of the substrate. In particular, this second nitridation step is useful for providing a portion of the substrate surface with an exposed nitridation layer while leaving the remaining portion of the substrate surface covered with an exposed buffer layer.

The process steps and conditions in the second nitridation are generally similar to the nitridation steps outlined above in reference to the first nitridation step. In one particular embodiment of the invention, the second nitridation comprises supplying a reactive nitrogen precursor, such as $NH_3$, diluted with a non-reactive gas at a temperature greater than about 950° C., for a time of less than about 5 minutes. Again, it is preferred that the non-reactive gas be present in an amount useful for maintaining a specified partial pressure of the nitrogen source. In one particular embodiment, this nitridation step is performed at a temperature of about 1000° C. to about 1050° C. to facilitate transition to the film deposition step described herein.

In addition to the above surface preparation steps, further steps may be useful in preparing a substrate for simultaneous deposition of a dual polarity Group III-nitride film. For example, one or more substrate cleaning step or additional substrate annealing step may be useful. In one embodiment, prior to the first nitridation step described above, the substrate is vacuum annealed for a time of about 1 to about 20 minutes at a temperature of about 900° C. to about 1200° C. Further according to this embodiment, prior to the first nitridation step, the vacuum annealed substrate is $H_2$ cleaned by supplying $H_2$, diluted with $N_2$ (preferably in a ratio of about 1:1), for time of about 1 to about 20 minutes at a temperature of about 900° C. to about 1200° C. Further steps useful in preparing a substrate for deposition of a Group III-nitride film, such as by CVD, that would be recognizable by one of skill in the art are also encompassed by the present invention. As previously noted, the $H_2$ cleaning step is optional and does not alter the preference that the remaining steps of the inventive method introduce substantially no $H_2$ gas, and most preferably completely avoids introduction of $H_2$ gas.

A substrate prepared according to the above steps is particularly suited for deposition of a dual polarity Group III-nitride film. The selectively patterned substrate has a portion of the substrate surface covered with an exposed nitridation layer that has been prepared specifically for facilitating deposition of a smooth N-polar Group III-nitride film. Further, the selectively patterned substrate has a portion of the substrate surface covered with an exposed buffer layer that has been prepared specifically for facilitating deposition of a smooth Group III-polar Group III-nitride film. Therefore, deposition of a smooth, dual polarity Group III-nitride film is easily achieved on the prepared substrate through a film deposition method.

The present invention further provides a method for preparing a dual polarity Group III-nitride film. In particular, the dual polarity film is selectively patterned according to a predetermined layout of one or more Group III-polar regions and one or more N-polar regions. FIG. 3 illustrates a controlled polarity film prepared according to the invention. In particular, the figure shows an optical micrograph of a GaN film having a precisely positioned and sized stripe of Ga-polar (+c) GaN film surrounded by N-polar (−c) GaN film. The method of the present invention is particularly useful in that films, such as seen in FIG. 3, can be deposited on a substrate such that the two polar orientations are deposited simultaneously. Further, both polar orientations can be deposited at the same deposition rate and can be deposited such that both polar orientations are smooth.

The invention can comprise multiple methods of depositing, growing, or applying a Group III-nitride film on a substrate. The invention is particularly suited to CVD methods, such as MOVPE. As is generally understood in the art, MOVPE comprises reacting a Group III metalorganic compound with a hydride of a Group V element at elevated temperature to produce a ITT-V compound according to the following general equation:

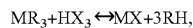

$$MR_3 + HX_3 \leftrightarrow MX + 3RH,$$

wherein M is a Group III metal, X is a Group V element, and R is an organic ligand, such as $CH_3$ or $C_2H_5$. Common Group III component precursors used in MOVPE include, but are not limited to, $Ga(CH_3)_3$, $Ga(C_2H_5)_3$, $Al(CH_3)_3$, $Al(C_2H_5)_3$, $In(CH_3)_3$. Common Group V component precursors used in MOVPE include, but are not limited to, $NH_3$, $PH_3$, and $AsH_3$. MOVPE is more fully described by Tischler, M. A., "Advances in Metalorgainc Vapor-Phase Epitaxy", *IBM J. Res. Develop.*, 34(6), November 1990, which is incorporated herein by reference.

As with conventional deposition methods, the methods of the present invention for depositing a Group III-nitride film on a substrate can encompass the use of one or more dopants. It is generally understood that dopants are impurities that are incorporated into the Group III-nitride film (either intentionally or unintentionally) during the deposition process.

Dopants can be included in the film to modify the electrical characteristics of the resulting film. Dopant types include the so-called p-type, or acceptor elements, and n-type, or donor elements. Donor elements commonly used in deposition methods, such as in the preparation of semiconductor parts, include silicon, sulfur, selenium, tin, and tellurium. Common acceptor elements include carbon, zinc, and magnesium. Such dopants, as well as other additives commonly recognized in the art as being useful in Group III-nitride film deposition methods, can also be used according to the present invention. Non-limiting examples of preferred donors and acceptors useful according to the invention are silicon and magnesium, respectively.

The mole fractions of the precursors used in preparing the ITT-V film must be accurately controlled in order to produce specific materials and structures, as the electrical characteristics of the ITT-V film deposited on a substrate are directly related to their growth parameters. MOVPE can be conducted in reactors designed to deliver the precursors in gaseous phase to a reaction chamber (often a quartz container) containing the substrate on which the film will be deposited. The metalorganics, which are generally liquid, are transported to the reaction chamber by bubbling a gaseous carrier through the liquid. Generally, in the prior art, $H_2$ is used as the carrier gas. However, as described herein, the present invention surprisingly allows for preparation of smooth N-polar and Group III-polar films deposited at the same rate through use of a non-reactive gas as the carrier gas, and also the diluent. Accordingly, deposition of the Group TI-nitride film is carried out under conditions such that substantially no $H_2$ gas is introduced from external sources. Preferably, introduction of $H_2$ gas is completely avoided.

In one embodiment, the invention provides a method for depositing a Group III-nitride film on a substrate with an exposed surface. In particular, the method comprises depositing a GaN film on an exposed substrate surface. Atomic species involved in the deposition of a GaN film according to the invention can include Ga, $NH_3$, $H_2$, RH (e.g., $CH_4$ or $C_2H_6$), and $N_2$. The growing surface of the GaN film as the gas-solid interface can be expressed according to the following equation:

$$Ga(g) + NH_3(g) \rightarrow GaN(s) + 3/2 H_2(g)$$

The Ga species reacts directly with the $NH_3$ according to the above equation. The GaN film is deposited on the substrate surface, and $H_2$ is produced as a by-product of the reaction. The deposition of GaN has been reported to be influenced by the $H_2$ partial pressure in the deposition reactor. The use of $H_2$ as a transport gas for carrying the reactants to the reaction chamber (as previously described in the art) increases the $H_2$ partial pressure. As a result of the increased $H_2$ partial pressure, enhanced etching of GaN occurs via reaction with the atomic and molecular hydrogen derived from the dissociation of the $NH_3$ and the $H_2$ diluent. Accordingly, when $H_2$ is used as a carrier or diluent in the deposition of the GaN film, it is generally accepted that a high molar ratio of Group V to Group III components must be maintained. For example, a V/III ratio greater than 2000 is generally regarded as necessary for Group III-nitride film deposition when $H_2$ is used.

The present invention is characterized by the discovery that using a non-reactive gas as both a carrier and a diluent (and thereby avoiding introduction of $H_2$ gas) unexpectedly improves the deposition process and allows for preparation of Group TII-nitrides with improved characteristics. In particular, the non-reactive gas is used as a replacement for $H_2$ gas. Dilution with a non-reactive gas reduces the partial pressure of hydrogen in the reaction system. Therefore, a much lower V/III ratio can be established, and this enables the preparation of smooth GaN films according to the invention in the Ga-polar orientation and the N-polar orientation. This is particularly beneficial in that it allows for a dramatic reduction in the amount of $NH_3$ that must be used as the nitrogen precursor, which correlates to a dramatic reduction in the process cost.

Accordingly, the invention can be particularly characterized in that it allows for the preparation of controlled Group III-nitride films prepared in the absence of $H_2$ gas (i.e., substantially free of introduced $H_2$ gas or completely free of introduced $H_2$ gas). In one embodiment of the invention, the deposition of the GaN film is carried out with a nitrogen precursor/Group III precursor ratio of less than about 1000. In another embodiment, the deposition of the GaN film is carried out with a nitrogen precursor/Group III precursor ratio of less than about 500. In still another embodiment of the invention, the nitrogen precursor/Group III precursor ratio is less than or equal to about 100. In one particular embodiment, the nitrogen precursor/Group III precursor ratio is from about 60 to about 80.

The use of a non-reactive gas, such as $N_2$ gas, as both a carrier and a diluent is further beneficial according to the invention for optimizing the deposition of the GaN film to equalize the growth rate of the Ga-polar film and the N-polar film. Under presently known deposition methods, such as conventional MOCVD, N-polar GaN films (in addition to having a rough surface morphology) are deposited at a slower rate than Ga-polar oriented films. At high temperature GaN film deposition conditions, film deposition rate is temperature independent when carried out in an $N_2$ ambient. By contrast, GaN film deposition rate decreases as temperature increases when $H_2$ ambient is used. In fact, deposition rate is reduced by approximately 50% between a temperature of 900° C. and 1100° C. under an $H_2$ ambient. Accordingly, under an $N_2$ ambient, GaN film deposition is mass-transfer limited, while under an $H_2$ ambient, GaN film deposition is reaction rate limited (i.e., kinetically limited). In relation to methods such as chemical vapor deposition, high quality films are desirably prepared at temperatures dominated by the mass-transfer limited region. Strong mass-transfer limited growth is necessary to circumvent the chemical reactivity difference between the Ga-polar orientation and the N-polar orientation of the GaN film and to achieve identical growth rates for the two polarities. The use of a non-reactive gas, such as $N_2$ gas, as a carrier and a diluent leads to deposition of smooth N-polar GaN films and also leads to the same deposition rate for both N-polar films and Ga-polar films.

It has been shown that (in the simplest cases) the deposition rate of the Group III-nitride film is limited by the diffusion of the III-atom carrying species through a gas boundary layer formed at the surface of the substrate on which the film is being deposited. Relating to the particular reactor geometry used according to one embodiment of the invention, deposition rate (or growth rate) can be expressed according to the following equation:

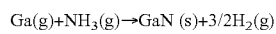

$$\frac{\dot{G}}{\dot{G}_0} = \frac{f_i}{f_i^0} \sqrt{\frac{f_T^0}{f_T}}$$

wherein G is the growth rate, $f_i$ is the III-atom carrying species flow rate, and $f_T$ is the total mass flow rate. The equation is referenced to a standard state (0) corresponding to standard process conditions used. Normalized growth rate as a function of the inverse square root of total flow, which is calculated by using the above equation in relation to a set of different growth conditions, can be used as evidence of mass-transfer limited deposition. When using the method of the present invention, there is a linear relationship between the normalized growth rate and the inverse square root of the total flow for the different growth conditions. This linear dependence illustrates that the growth according to the present invention using $N_2$ as the carrier and diluent is mass-transfer limited. Accordingly, both the Group III-polarity and the N-polarity of a Group III-nitride film deposited according to the present invention using $N_2$ ambient will be deposited at the same rate, independently of the growth conditions.

This further distinguishes the present invention from other film deposition methods in that according to traditional film deposition processes, N-polar films and Ga-polar films have separate growth rates that differ by as much as a factor of 10. According to the present invention, however, N-polar and Ga-polar films can be grown simultaneously at a substantially similar rate such that growth rates for the two film polarities differ by less than about 20%. Preferably, the growth rate for the two film polarities differs by less than about 15%, most preferably less than about 10%. In one particular embodiment, an N-polar film and a Ga-polar film were grown simultaneously, each at a rate of about 1.2 µm/hr with an experimental uncertainty of about +/−0.1 µm/hr.

As is generally established in the art, N-polar GaN films are characterized by a rough surface morphology featuring hexagonal pyramids. As established above, however, the present invention is particularly beneficial in its ability to provide Group III-nitride films that are smooth in the N-polar orientation, as well as the Group III-polar orientation. Smoothness, as used herein, is intended to refer to a minimized surface roughness. In the common usage of the word, a smooth surface is a surface that is continuously even. In relation to Group III-nitride films, smoothness is not easily determined through visual inspection alone. Accordingly, a smooth Group III-nitride film according to the present invention is a film having a minimized surface roughness defined by a root mean square (rms) roughness.

Roughness evaluated on an rms scale is a commonly recognized and often used parameter in the field of optics and other technological fields, such as electronics, where surface specifications are required to be within precise ranges. In determining an rms roughness for a given surface, the surface topography can be represented as a surface profile, $z(x)$. Surface topography is generally a series of peaks and valleys deviating by a certain distance from a mean line. The greater the distance of the peaks and valleys from the mean line, the rougher the surface. In the surface profile, z represents the distance from the mean line at a specific point along the line on the surface being measured, and x represents the number of measurements evaluated to determine rms roughness along the line. Accordingly, rms roughness (Rq) is defined as the root mean square of the deviations of the surface profile, $z(x)$, from the mean line. This is calculated according to the following equation:

$$Rq = \left[\frac{1}{L}\int_0^L z^2(x)dx\right]^{1/2}$$

where L is the length of the surface profile along the x-direction. The rms roughness is generally designated by Rq in documentary standards and is often represented in certain fields, such as optics, by the symbol σ. Because surface profiles $z(x)$ are closely approximated in nearly all modern instruments by a digitized set of points $z_i$, the above equation can be replaced in practice by its digital equivalent:

$$Rq = \left[\frac{1}{N}\sum_{i=1}^{N} z_i^2\right]^{1/2}$$

where N is the number of data points in a measured surface profile.

Various profiling techniques are available that are capable of measuring surface roughness in a nanometer scale. Examples of such techniques include stylus-based profiling, phase-shifting interferometric microscopy, Nomarski profiling, and atomic force microscopy (AFM). Of these methods, AFM is often recognized as producing the highest lateral resolution, generally of 1 nm or less. Surface roughness evaluation is further described by Vorburger, T., Fu, J., and Orji, N., "In the Rough", SPIE's *oe Magazine*, 2(3), March 2002, p. 31-34, which is incorporated herein by reference.

As recognizable from the preceding discussion, the methods of the present invention are particularly suited for preparing coated substrates. The coated substrates of the invention are characterized both by the controlled polarity of the Group III-nitride film on the surface of the substrate and by the smoothness of the film in the N-polar orientation. This is a departure from previously prepared Group III-nitride films in that smooth films have only been achievable in Group III-polar films. Previous methods for preparing N-polar films have resulted in films having an rms roughness on the order of about 100 nm. According to the present invention, it is possible to prepare N-polar Group III-nitride films having an rms roughness of less than about 10 nm, preferably less than about 8 nm, more preferably less than about 4 nm, and most preferably less than about 2 nm.

In another embodiment, the invention is useful for preparing Group III-polar films having an rms roughness of less than about 10 nm, preferably less than about 8 nm. More preferably, the Group III-polar films have an rms of less than about 4 nm, still more preferably less than about 2 nm. In one particular embodiment, it is possible to prepare Group III-polar films having an rms roughness of less than about 1 nm.

In another embodiment, the invention provides a coated substrate wherein the coating comprises a dual polarity Group III-nitride film that is selectively patterned on the exposed surface of the substrate. Again, the dual polarity Group III-nitride film is particularly characterized in that the surface of the film is smooth across both the Group III-polar portion of the film and the N-polar portion of the film.

One embodiment of a dual polarity Group III-nitride film according to the invention is provided in FIG. 4, which illustrates a c-plane sapphire substrate with a Group III-polar film deposited over a buffer layer on one portion of the substrate surface and an N-polar film deposited over another portion of the substrate surface without an underlying buffer layer. Such dual polarity film coated substrates are particularly useful for preparing lateral polarity homostructures or heterostructures. Lateral polarity templates modulate the electrical spontaneous polarization or induced charge, which strongly affects the electrical and optical properties of Group III-nitride based devices. Accordingly, dual polarity films, such as provided by the present invention, are useful for improving current devices and for preparing new optical and electrical devices that exploit the unique properties of the inventive dual polarity films. For example, electronic devices could be prepared that exploit the boundary between the orientation domains as tunnel junction barriers between regions with two dimensional electron gasses in a lateral GaN/AlGaN/GaN heterostructure. Further, the ability to prepare lateral polarity heterostructures according to the present invention also allows for further technology development within the Group III-nitride family of films.

The dual polarity films according to the invention are further beneficial in their ability to allow for three-dimensional homostructures and heterostructures. For example, the coated substrate of the invention could comprise a GaN film deposited on a GaN substrate. Further, multiple GaN deposition layers could be prepared. Such three-dimensional, polarity controlled structures could provide even further advantages over those noted above in relation to the dual polarity films of the invention.

The dual polarity films prepared according to the invention are still further beneficial in the ability to prepare films with precisely formed lateral p-n junctions, which provide materials having properties differing from with p-type materials or n-type materials alone. Further, such materials can give rise to materials particularly useful in complementary metal oxide semiconductor (CMOS) technology.

N-polar films according to the invention can be unintentionally doped to be n-type with a carrier concentration of about $1\times10^{18}$ cm$^{-3}$, while Ga-polar films according to the invention can be insulating with a maximum carrier concentration of less than about $1\times10^{16}$ cm$^{-3}$. In a lateral polarity structure, such as can be prepared according to the invention, the N-polar regions remain highly conductive while the Ga-polar regions remain insulating. Accordingly, the heterostructures can be intrinsic semiconducting films with the capability of being doped in a controlled manner to achieve specified results.

EXPERIMENTAL

The present invention is more fully illustrated by the following examples, which are set forth to illustrate the present invention and are not to be construed as limiting.

Example 1

MOVPE Process for Preparing a Lateral GaN-Based Dual-Polarity Structure on c-Sapphire A lateral, dual polarity GaN film was grown on c-sapphire according to one embodiment of the invention. The sapphire substrate was prepared by vacuum annealing the exposed substrate surface at 1080° C. for 10 minutes followed by cleaning the substrate surface with hydrogen gas using 1:1 ratio of H$_2$ to N$_2$ at 1080° C. for 10 minutes at a reactor pressure of 20 Torr.

Nitridation of the substrate surface was performed with a 1:1 ratio of NH$_3$ to N$_2$ at a temperature of 955° C. for 2 minutes with a reactor pressure of 20 Torr. An AlN buffer layer was then applied to the nitrided substrate surface. TMA and NH$_3$ were used aluminum and nitrogen sources, respectively, at a V/ITT ratio of 24,500. The deposition was performed with 2 slm NH$_3$ and 3 slm N$_2$ for a total flow of 6.01 slm at a temperature of 640° C. and a reactor pressure of 20 Torr for 10.5 minutes. The buffer layer was annealed using 0.4 slm NH$_3$ and 1.6 slm N$_2$ at 1030° C. for 10 minutes at a reactor pressure of 20 Torr. These conditions were maintained while the reactor was cooled to room temperature at a rate of 70° C./minute.

The cooled substrate was removed from the reactor for patterning. An evaporated Ti mask was applied to the portion of the substrate where it was desired to retain the buffer layer, and the substrate was subjected to 6M KOH at 60° C. for one minute to remove the exposed AlN buffer to expose the bare sapphire substrate. The Ti mask was removed, and the selectively patterned substrate was reintroduced into the reactor.

Reactor temperature was raised at a rate of about 270° C./minute to 1030° C. while supplying 1 slm N$_2$ with a total reactor pressure of 20 Torr. The selectively patterned substrate was subjected to a second nitridation using a 1:1 ratio of NH$_3$ to N$_2$ at a temperature of 1030° C. for 1 minute with a reactor pressure of 20 Torr. The substrate was thus prepared for deposition of the dual polarity GaN film.

GaN film deposition was performed using 0.4 slm NH$_3$, 1.6 slm N$_2$, and TEG with a V/ITT ratio of 500 and a total flow of 2.15 slm. Reactor temperature was 1030° C., and reactor pressure was 20 Torr. These deposition conditions with the prepared substrate resulted in a growth rate of 1.2 μm/hr for both the Ga-polar portion of the film and the N-polar portion of the film. The reactor was cooled at a rate of 30° C./minute using 0.4 slm NH$_3$ and 1.6 slm N$_2$ with a reactor pressure of 20 Torr. A Ga-polar film (+c) was deposited on the portion of the substrate with an exposed AlN buffer layer, and an N-polar film (−c) was deposited on the portion of the substrate with an exposed nitridation layer. The film was generally characterized as smooth across both the Ga-polar portion and the N-polar portion, having an rms roughness of about 1 nm.

Example 2

Preparation of Controlled Polarity GaN Films on c-Plane Sapphire

Multiple GaN films were prepared by MOCVD under specific process conditions to determine optimized parameters for controlling polar orientation of the deposited film. All films were prepared in a vertical, cold-wall, RF-heated, low pressure reactor. The reactor base pressure was $1\times10^{-7}$ Torr. Triethylgallium (TEG), trimethylaluminum (TMA), and NH$_3$ were used as the Ga, Al, and N precursors, respectively. The sole transport gas (carrier) used during the preparation was N$_2$, which as also used as the sole diluent in the appropriate steps. Substrates for coating were (0001)-oriented sapphire wafers of 2 inch diameter.

The substrate wafers were initially vacuum annealed in H$_2$ at 1090° C. to clean the substrates. While used for cleaning, no H$_2$ was introduced in the system during the preparation of the coated substrate. Seven separate coated substrates were prepared according to specific substrate preparation steps, which are described below. Each substrate was then subjected to GaN film deposition under standard conditions and subsequently subjected to wet etching in KOH to determine the polar orientation of the separate coated substrates. Standard deposition conditions consisted of a TEG flow of 36 μmol/min, NH$_3$ flow of 0.4 slm, and a total process flow of 2.15 slm at 20 Torr total pressure. High temperature GaN deposition took place at 1030° C. These conditions provided a nitride/Group III ratio of 500 and a growth rate of 1.2 μm/h. The process steps, polar orientation, and the result of the etch test for each sample are provided below in Table 1.

Samples A-D

Substrate preparation consisted of nitridation with a 1:1 ratio of NH$_3$ and N$_2$ at 930° C. Nitridation times vary according to the following schedule: Sample A—30 seconds; Sample B—1 minute; Sample C—2 minutes; and Sample D—5 minutes. No further substrate preparation was done prior to deposition of the GaN film.

Sample E

Sample E received no substrate preparation, and the GaN film was deposited directly on the cleaned sapphire substrate surface.

Samples F-G

Each of Samples F and G were subjected to nitridation with a 1:1 ratio of $NH_3$ and $N_2$ at 930° C. for a duration of 2 minutes. An AlN buffer layer was applied to each of the samples using a 1:1 ratio of $NH_3$ and $N_2$, with TMA present in an amount necessary to achieve a nitride/Group III ratio of 24,500. Buffer layer deposition was carried out at a temperature of 600° C. for approximately 5-10 minutes to achieve a desired buffer layer thickness. In sample F, the AlN buffer layer was applied to a thickness of 40 nm. In sample G, the AlN buffer layer was applied to a thickness of 20 nm. Both samples were annealed for 20 minutes using $NH_3$ at 0.4 slm and $N_2$ at 1.6 slm. The anneal step began immediately after buffer layer deposition, and the anneal temperature was increased over the duration of the anneal step from 600° C. to 1030° C.

TABLE 1

| Sample | Nitridation | LT-AlN Buffer Thickness | Buffer Anneal Time | KOH Effect | Polar Orientation |
|---|---|---|---|---|---|
| A | 30 sec. | NA | NA | Etch | N |
| B | 1 min. | NA | NA | Etch | N |
| C | 2 min. | NA | NA | Etch | N |
| D | 5 min. | NA | NA | Etch | N |
| E | NA | NA | NA | Lift-off | Ga |
| F | 2 min. | 40 nm | 20 min. | Inert | Ga |
| G | 2 min. | 20 nm | 20 min. | Etch | Mixed |

As seen from Table 1, the seven separate samples generally resulted in four types of coated substrates. GaN films grown directly on the sapphire substrate with no prior substrate surface preparation exhibited Ga-polarity (Sample E). Treatment with KOH resulted in lift-off of the film from the substrate. This is likely indicative of lattice mismatch between the GaN film and the sapphire substrate surface. Accordingly, the KOH attacked the interface of the film and the substrate surface, which accumulated a high density of stacking faults and dislocations. This indicates that while Ga-polar films can be deposited on a sapphire substrate with no surface preparation, such deposited films do not exhibit stable binding of the film.

In the remaining six samples (A-D and F-G), all samples were subjected to substrate surface nitridation. In samples A-D, no buffer layer was applied, and the GaN film was deposited directly on the nitridation layer. As expected according to the invention, each of these samples resulted in deposition of N-polar GaN films (with rms roughness varying from about 2 nm to about 2.5 nm). Samples F and G were both nitridated under identical conditions, had an AlN buffer layer applied, and had the buffer layer annealed under the same conditions. The sample differed only in buffer layer thickness. In Sample G, KOH treatment resulted in a surface etch indicating a mixed-polar orientation. With the thicker buffer layer, in Sample F, a pure Ga-polar film was deposited, the surface being inert to KOH.

Many modifications and other embodiments of the inventions set forth herein will come to mind to one skilled in the art to which these inventions pertain having the benefit of the teachings presented in the foregoing description. Therefore, it is to be understood that the inventions are not to be limited to the specific embodiments disclosed and that modifications and other embodiments are intended to be included within the scope of the invention. Although specific terms are employed herein, they are used in a generic and descriptive sense only and not for purposes of limitation.

What is claimed is:

1. A method of preparing a substrate with an exposed surface for simultaneous deposition of a dual polarity Group III-nitride film, said method comprising:
    (a) performing a first nitridation of the substrate to cover the exposed surface of the substrate with a nitridation layer;
    (b) applying a buffer layer to the surface of the substrate with the nitridation layer thereon;
    (c) annealing the buffer layer;
    (d) selectively patterning the substrate surface comprising selectively removing a portion of the buffer layer from the substrate surface, thereby exposing a portion of the substrate surface;
    (e) optionally, annealing the selectively patterned substrate surface; and
    (f) performing a second nitridation of the substrate such that a portion of the substrate surface is covered with an exposed nitridation layer and the remaining portion of the substrate surface is covered with an exposed buffer layer.

2. The method of claim 1, wherein the substrate comprises c-plane sapphire.

3. The method of claim 1, wherein substantially no hydrogen gas is introduced from external sources.

4. The method of claim 1, wherein introduction of hydrogen gas from external sources is completely avoided.

5. The method of claim 1, wherein said first and second nitridation steps comprise supplying ammonia diluted with a non-reactive gas.

6. The method of claim 5, wherein said non-reactive gas comprises nitrogen gas.

7. The method of claim 5, wherein said first and second nitridation steps are each carried out at a temperature greater than about 800° C.

8. The method of claim 5, wherein said first and second nitridation steps are each carried out for a time of less than about 5 minutes.

9. The method of claim 1, wherein the buffer layer is applied to a thickness of about 10 nm to about 100 nm.

10. The method of claim 9, wherein said annealing step is carried out at a temperature of between about 950° C. and about 1100° C.

11. The method of claim 9, wherein said annealing step is carried out for a time of between about 5 minutes and about 30 minutes.

12. The method of claim 1, wherein said annealing step comprises supplying ammonia diluted with a non-reactive gas.

13. The method of claim 12, wherein said non-reactive gas comprises nitrogen gas.

14. A method for depositing a dual polarity Group III-nitride film on a substrate having an exposed surface, said method comprising:
    (a) performing a first nitridation of the substrate to cover the exposed surface of the substrate with a nitridation layer;
    (b) applying a buffer layer to the surface of the substrate with the nitridation layer thereon;
    (c) annealing the buffer layer;

(d) selectively patterning the substrate surface comprising selectively removing a portion of the buffer layer from the substrate surface;

(e) optionally, annealing the selectively patterned substrate surface;

(f) performing a second nitridation of the substrate such that a portion of the substrate is covered with an exposed nitridation layer and the remaining portion of the substrate surface is covered with an exposed buffer layer; and (g) depositing a Group III-nitride film on the substrate such that the film deposited on the portion of the substrate with the exposed nitridation layer is N-polar, and the film deposited on the portion of the substrate with an exposed buffer layer is Group III-polar.

15. The method of claim 14, wherein said step of depositing a Group III-nitride film comprises CVD.

16. The method of claim 14, wherein substantially no hydrogen gas is introduced from external sources.

17. The method of claim 14, wherein introduction of hydrogen gas from external sources is completely avoided.

18. The method of claim 14, wherein a non-reactive gas is used as both a carrier and a diluent.

19. The method of claim 18, wherein said non-reactive gas comprises nitrogen gas.

20. The method of claim 14, wherein the nitrogen precursor/Group III precursor ratio is less than about 1000.

21. The method of claim 14, wherein said first and second nitridation steps comprise supplying ammonia diluted with a non-reactive gas to the substrate at a temperature greater than about 800° C. for a time of less than about 5 minutes.

22. The method of claim 14, wherein the buffer layer is applied to a thickness of about 10 nm to about 100 nm.

23. The method of claim 14, wherein said annealing step comprises supplying ammonia diluted with a non-reactive gas to the substrate at a temperature of between about 950° C. and about 1100° C. for a time of between about 5 minutes and about 30 minutes.

24. The method of claim 14, wherein the N-polar film and the Group III-polar film are each deposited at about the same rate.

25. The method of claim 14, wherein said deposition of the Group III-nitride film is mass-transfer limited.

26. A method of depositing a Group III-nitride film on a substrate with an exposed surface, said method comprising:

(a) performing a nitridation of the substrate to cover the exposed surface of the substrate with a nitridation layer, wherein said nitridation comprises supplying ammonia diluted with a non-reactive gas and said nitridation is carried out at a temperature greater than about 800° C. for a time of less than about 5 minutes; and (b) depositing a Group III-nitride film on the surface of the substrate with the nitridation layer thereon such that the deposited film is N-polar, wherein said depositing step comprises supplying a Group III metal precursor and a nitride precursor with a carrier consisting of a non-reactive gas such that the nitrogen precursor/Group III precursor ratio is less than about 1000;

wherein said deposited film has an rms roughness of less than about 8 nm.

27. The method of claim 26, wherein said step of depositing the Group III-nitride film comprises CVD.

28. The method of claim 26, wherein substantially no hydrogen gas is introduced from external sources.

29. The method of claim 26, wherein introduction of hydrogen gas from external sources is completely avoided.

30. A method of depositing a Group III-nitride film on a substrate with an exposed surface, said method comprising:

(a) performing a nitridation of the substrate to cover the exposed surface of the substrate with a nitridation layer, wherein said nitridation comprises supplying ammonia diluted with a non-reactive gas and said nitridation is carried out at a temperature greater than about 800° C. for a time of less than about 5 minutes;

(b) applying a buffer layer to the surface of the substrate with the nitridation layer thereon, wherein buffer layer is applied to a thickness of about 10 nm to about 100 nm;

(c) annealing the substrate with the buffer layer applied thereto, said annealing comprising supplying ammonia diluted with a non-reactive gas and wherein said annealing is carried out at a temperature of between about 950° C. and 1100° C. for a time of between about 5 minutes and about 30 minutes; and (d) depositing a Group III-nitride film on the surface of the substrate with the annealed buffer layer thereon such that the deposited film is Group III-polar, wherein said depositing step comprises supplying a Group III metal precursor and a nitrogen precursor with a carrier consisting of a non-reactive gas such that the nitrogen precursor/Group III precursor ratio is less than about 1000;

wherein said deposited film has an rms roughness of less than about 8 nm.

31. The method of claim 30, wherein substantially no hydrogen gas is introduced from external sources.

32. The method of claim 30, wherein introduction of hydrogen gas from external sources is completely avoided.

33. The method of claim 30, wherein said step of depositing the Group III-nitride film comprises CVD.

\* \* \* \* \*